United States Patent [19]

Thurmond

[11] 4,164,715
[45] Aug. 14, 1979

[54] FEEDBACK ELIMINATION SYSTEM EMPLOYING NOTCH FILTER

[76] Inventor: George R. Thurmond, 4709 Shoalwood, Austin, Tex. 78756

[21] Appl. No.: 882,638

[22] Filed: Mar. 2, 1978

Related U.S. Application Data

[62] Division of Ser. No. 756,135, Jan. 3, 1977, Pat. No. 4,088,834.

[51] Int. Cl.² ............................................. H03F 1/34
[52] U.S. Cl. ..................................... 330/85; 330/109; 330/126
[58] Field of Search ................. 330/85, 107, 109, 126, 330/294; 179/1 D; 331/138, 140, 142; 328/167

[56] References Cited

U.S. PATENT DOCUMENTS

| | | | |
|---|---|---|---|
| 2,173,427 | 9/1939 | Scott | 331/140 X |
| 3,170,120 | 2/1965 | Jensen et al. | 330/109 |
| 3,408,590 | 10/1968 | Moscaytz | 330/107 X |
| 3,752,928 | 8/1973 | Flickinger | 330/109 X |

*Primary Examiner*—James B. Mullins
*Attorney, Agent, or Firm*—Leydig, Voit, Osann, Mayer & Holt, Ltd.

[57] ABSTRACT

Feedback elimination apparatus for a sound system which includes a notch filter assembly comprising a plurality of active notch filters connected in parallel with one another. Each of the notch filters is formed of a loop amplifier circuit including an operational amplifier having a resonant feedback network so arranged that in the normal mode an auxiliary signal peaked at the resonant frequency is applied out-of-phase to the system, thereby to establish a notch in the frequency characteristic curve of the system. An improved loop circuit is used to produce a notch which is sharp and well defined, with auxiliary circuitry for aligning the notch with a feedback signal. In the preferred embodiment means are provided for temporarily switching the notch filter into an oscillating mode in which it oscillates at notch frequency to produce an audible reference signal. A manual control in the notch filter smoothly varies the frequency of the resonant network so that the reference signal is swept over the audio range to establish zero beat with a "first" acoustic feedback signal. Thus when the notch filter is restored to its normal mode the notch is in alignment with the feedback signal, the depth of the notch being subsequently increased as necessary to the point where the feedback signal is cancelled. The system gain is then incrementally advanced to produce additional feedback signals and the procedure is repeated for each of the notch filters until each acoustic feedback signal has been disposed of.

4 Claims, 3 Drawing Figures

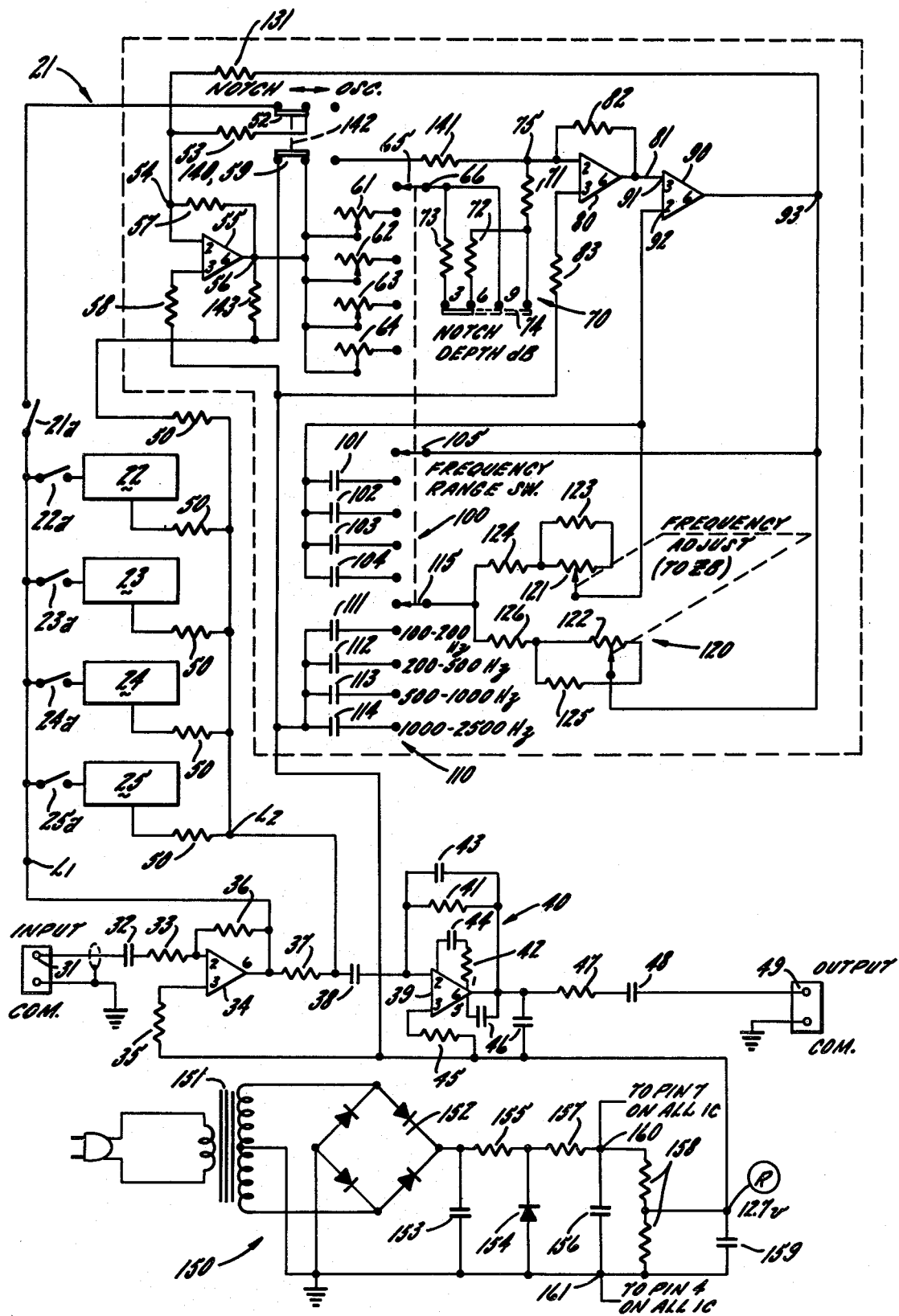

FEEDBACK ELIMINATION SYSTEM EMPLOYING NOTCH FILTER

This is a division of application Ser. No. 756,135, filed Jan. 3, 1977, issued as U.S. Pat. No. 4,088,834 on May 9, 1978.

Acoustic feedback occurs in a sound system whenever the reflected or direct sound impinges on the system microphone in phase and at an amplitude at least equal to the originating sound. At this point, the system becomes violently unstable and develops a rapidly-mounting and highly disconcerting "squeal" whose volume is limited only by the first non-linearity encountered by the oscillating system, which is very often the finite power-handling capability of the system amplifier or speaker.

Unfortunately, because of the multitude of reflections and the broad range of wavelengths involved, the phase condition for acoustic feedback in almost any acoustic environment is satisfied at a great many frequencies within the broad audible spectrum. It is obvious that with a ratio of 1000 to 1 in wavelength, the phase problem cannot be controlled easily, if at all. Traditionally, therefore, attempts at reducing the effects of acoustic feedback by electronic means have been aimed at reducing the amplitude condition for feedback through the use of electronic traps tuned to those frequencies that satisfy the conditions for feedback.

Several practical electronic methods for reducing acoustic feedback are currently in use. These are based largely on the use of a broad band equalization process utilizing fixed tuned filters one-third of an octave in width, and in overlapping relation, which are connected in series with the system amplifier. These filters are adjusted individually to compensate electronically for the irregularities which exist in the acoustical environment, as well as in the sound reinforcing system, by flattening and shaping the "house curve" to achieve greater intelligibility and sound fidelity. This process in itself usually increases available acoustic gain substantially, as it removes peaks in the system response. It is, however, possible to further increase available acoustic gain and achieve higher intelligibility without upsetting the previously established broad-band shaping. This can be accomplished by utilizing a number of additional high "Q" filters (approximately 1/20 of an octave wide), precisely tuned to critical feedback frequencies or ring modes.

A method widely used for feedback suppression reduces the gain of the system at the required critical frequencies through the use of fixed high "Q" passive notch filters. These relatively simple LC filters are all connected in series with the amplifier system. A plug-in arrangement permits a number of fixed tuned filters to be inserted conveniently into the path of amplification. This method has the virtue of being simple and straightforward and reliable once it is successfully installed.

One of the drawbacks inherent in the foregoing method, however, is the complex procedure required to select the proper plug-in filters for a given installation. First it is necessary to identify individual frequencies, which is difficult at best, for the following reasons: The system gain control must be continuously and sensitively adjusted by hand to excerpt a single pure tone in order to be able to read out this frequency on a frequency meter. If the system refuses to ring cleanly at one frequency only, then an oscilloscope and oscillator connected to display Lissajous figures may be used to discriminate between several frequencies. Such procedures require considerable skill and experience.

A second problem inherent in this method is that the practitioner must stock a sufficient inventory of filters so that the right filter is immediately at hand once the exact frequency of oscillation is determined, alternatively, each filter must be tuned to a measured frequency.

A third inherent disadvantage is that available filters must be driven from a 600 ohm source and be loaded with a 600 ohm load. This requires the driving amplifier to have a 600 ohm output, capable of driving a 600 ohm load at 1 volt level, or higher, without undue distortion. While this does not appear to be a difficult requirement, it does pose considerable inconvenience. Moreover, the insertion loss, at the conventional level of 6 dB, plus the attenuation injected by the notching process, usually requires the addition of a line amplifier.

A final inherent drawback is that the fixed tuned notch filters do not lend themselves to easy readjustment required by small changes usually occurring in sound reinforcement systems; i.e., aging of system components, changes in the physical rearrangements of the equalized auditorium, or even changes in the number and distribution of the audience.

Obviously, it would be desirable to have electronic, continuously tunable notch filters available that would at least eliminate the inventory problem. However, while it is reasonable to assume reliable operation from even a large number of cascaded passive networks, the same certainly does not hold true for cascading active filters in the numbers required for effective feedback elimination, because these filters usually are quite complex, having many components subject to failure. It is important to note that the failure of any series-connected filter in the active filter chain results in failure of the entire audio system.

Another serious objection to the cascading of active notch filters is the higher noise level it generates. Each and every filter in the chain will add noise over the entire audio spectrum. To offset this, the audio input level to the filters must be high. This, in turn, may pose serious overload problems, especially since the distortion of each filter section is also additive.

It is, accordingly, an object of the invention to provide an anti-feedback circuit and procedure which is more effective and free of many of the problems which have been associated with anti-feedback schemes in the past.

It is a more specific object to provide an anti-feedback notch filter assembly which is simple, compact, inexpensive and self-contained, which does not require auxiliary test equipment, and which does not require any inventory of filters. It is a related object to provide an anti-feedback arrangement which permits prompt identification of an offending feedback signal but which does not require that the offending frequency be measured or known in order to adjust the circuit for cancellation purposes. It is an object to provide a procedure for adjusting a plurality of notch filters for cancellation of a series of acoustic feedback signals which involves temporarily placing each notch filter into an oscillation mode to produce a reference signal which is zero-beat with the offending feedback signal. The procedure enables the adjustment to be quickly confirmed at any time and a readjustment or "touch up" made whenever a change is made in the auditorium, in the basic sound equipment, or even in the number and distribution of the audience.

It is a further object to provide a notch filter assembly which is universal in usage, which is compatible with any equipment which may be employed in the system. It is a related object to provide an anti-feedback arrangement which does not degrade the quality of the reproduction of the system and which minimizes changes in the frequency response curve of the system. A "Q" is achievable which is equal to or better than that obtained employing conventional passive filters. It is an important object to provide an active notch filter assembly in which the notch filters are connected in parallel to produce a system which has no cumulative phase error, as where series filters are used, and which is highly reliable and largely fail-safe. Finally it is an object to provide a specific notch filter circuit which results in a notch which is much sharper than can be produced by a notch filter of more conventional design.

Other objects and advantages of the invention will become apparent upon reading the attached detailed description and upon reference to the drawings in which:

FIG. 3 is a more complete circuit diagram showing the details of the resonant feedback network and including the associated power supply.

While the invention has been described in connection with a preferred embodiment, it will be understood that I do not intend to limit the invention to the embodiment shown but intend, on the contrary, to cover all of the various alternative and equivalent circuits included within the spirit and scope of the appended claims.

Figure 1:
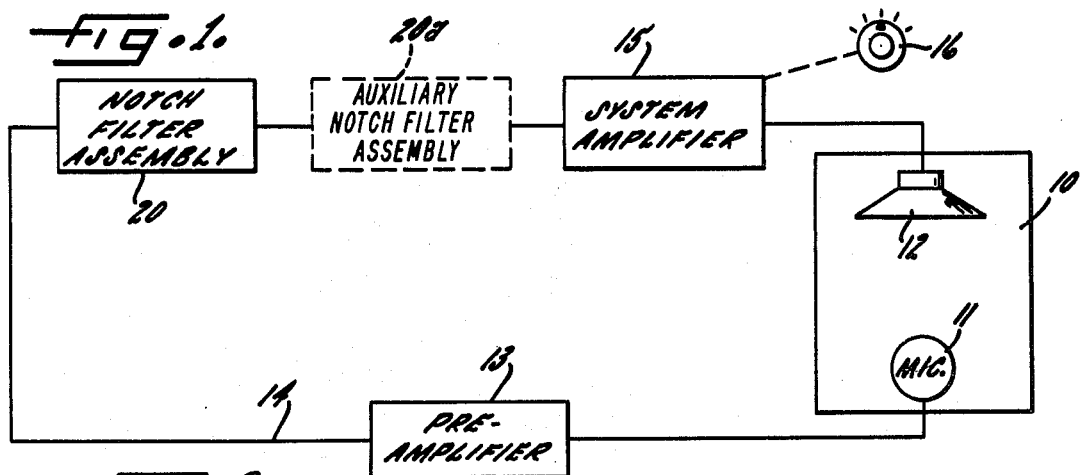
FIG. 1 shows a typical sound system employing the present invention.

Turning now to the drawings, there is shown in FIG. 1 a typical sound system for an auditorium diagrammatically indicated at 10 having a microphone 11 and one or more loudspeakers 12. The signal from the microphone is amplified by a preamplifier 13 which is connected to a line 14 feeding a system amplifier 15, the system amplifier being equipped with the usual gain or level control 16. It is to be expected that in the average room or auditorium having sound reflecting surfaces, reinforcement will occur at one or more frequencies resulting in acoustical feedback or "squealing" at such frequencies which, in the absence of corrective circuitry, can only be taken care of by reducing the setting of the gain control, which severly limits the capability of the system.

Figure 2:
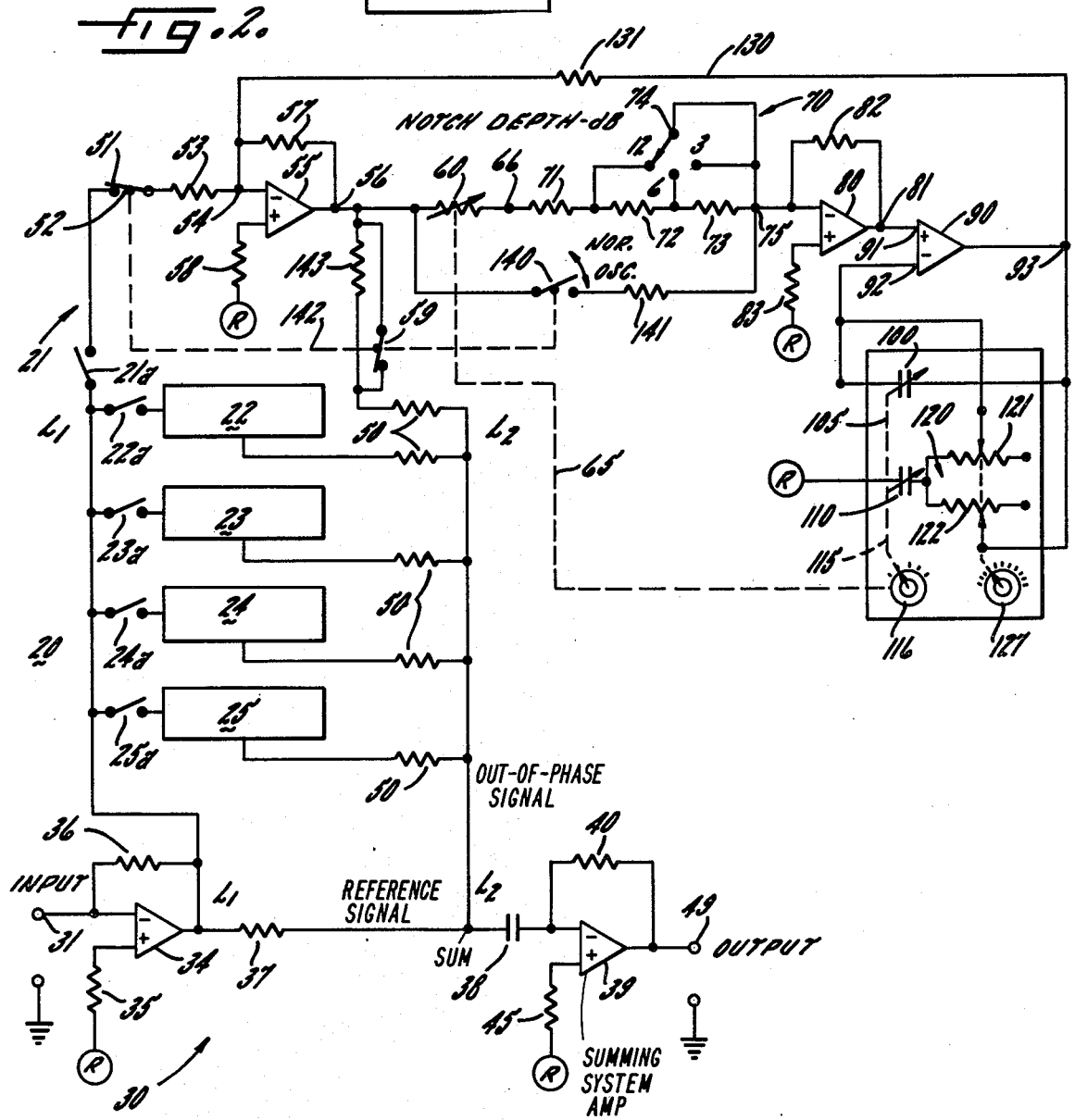
FIG. 2 is a simplified circuit diagram of the notch filter assembly employed in FIG. 1.

In accordance with the present invention there is provided, in series with the line 14, a notch filter assembly 20 having a plurality of notch filters of the active type connected in parallel and each of which is capable of feeding into the system an auxiliary signal at an offending frequency, but in out-of-phase relation, thereby to establish a notch in the frequency characteristic curve of the system so that the gain setting can be increased to a maximum level without acoustical feedback. An auxiliary notch filter assembly 20a may be connected in series with the assembly 20 to provide even more notches. Referring to FIG. 2, and to FIG. 3 which is in greater detail, it will be seen that the assembly 20 includes a total of five active notch filters indicated at 21–25 having enabling switches as shown, for example, at 21a–25a. The circuit of filter 21 has been shown, and it will be understood that the filters 22–25 are identical thereto but capable of separate adjustment to permit cancellation of offending feedback signals at a total of five different frequencies.

The assembly 20 has a "straight through" or "bus" circuit 30 having an input terminal 31 connected via a capacitor 32 and resistor 33 to a first operational amplifier 34. The amplifier has a second, or reference, input terminal which is connected via a resistor 35 to a point of voltage reference "R" on the power supply, described in connection with FIG. 3. A feedback resistor 36 is connected across the amplifier input and output terminals. The amplifer 34 is in the form of a commercially available linear integrated circuit amplifier, typically of the type 741. Connected to the output of the amplifier 34 is a series resistor 37 which forms one leg of a voltage divider, or summing circuit. The ends of the resistor are respectively connected to a loop input line L1 and a summing bus L2. The summing bus is coupled, by means of a capacitor 38, to the input of a second operational amplifier 39 having a feedback network generally indicated at 40. Such network is shown in greater detail in FIG. 3 as being made up of resistor 41 and capacitor 43. A resistor 45 connected to the second input terminal leads to the point of reference R. The output circuit is completed by a series resistor 47 and capacitor 48 leading to an output terminal 49. Elements 42, 44, 46 serve to provide frequency compensation. The operational amplifier 39 is preferably of the type commercially designated 1709. Both the input operational amplifier 34 and the output amplifier 39 are of wide band configuration and connected, as indicated by the polarity, to produce a 180° inversion of the signal, so that the signal at the output terminal 49, as a result of the double inversion, is in phase with the signal at the input.

It is to be especially noted that the notch filters 21–25 are all parallel-connected to the summing bus L2 through individual summing resistors 50.

Turning next to the circuit of the notch filter 21 taken as representative at the top of FIGS. 2 and 3, it includes an input terminal 51 which is connected via a normally closed switch 52 (to which reference will later be made) to an input resistor 53 which is connected, in turn, to the input connection 54 of an operational amplifier 55 which may be of type 741. The operational amplifier has an output terminal 56, a negative feedback path being provided via a resistor 57 to the input terminal 54. A resistor 58 leads to the point of reference R. The circuit to the summing bus L2 is completed through a normally closed switch 59 and summing resistor 50.

From the amplifier output terminal 56, the circuit continues through a settable resistor 60. As shown in FIG. 3, the resistor 60 is made up of four sections 61–64 selectable by a tap switch 65 having an output terminal 66 and a drive connection. Next interposed in the circuit is a notch depth network 70 having resistors 71, 72, 73 which are selectable by a tap switch 74, the network having an output terminal 75.

Fed by terminal 75 is an operational amplifier 80 preferably of the type 741, having an output terminal 81 which is coupled, via a negative feedback resistor 82, to terminal 75. A resistor 83 leads to the reference point R.

Both of the operational amplifiers 55, 80 are connected to invert the signal. Because of the double inversion the signal at terminal 81 is in phase with the signal appearing at input terminal 51.

In accordance with the present invention, the amplifier circuit in the notch filter is connected in a loop, the loop including an operational amplifier having a resonant feedback network which is adjustable in frequency so that in the normal mode an auxiliary, or cancellation, signal at the resonant frequency is applied out-of-phase to the summing bus thereby to establish a notch in the frequency characteristic curve of the system. Means are also provided for temporarily switching the notch filter into an oscillating mode in which it oscillates at notch frequency for establishing a reference signal which may be smoothly swept into zero beat relation with an acoustic feedback signal in the system. Consequently, when the notch filter is restored to its normal mode, the notch is aligned with the acoustic feedback signal so that the acoustic feedback is cancelled.

Thus, referring to both FIGS. 2 and 3, an operational amplifier 90 is provided, typically of the type 741, having a direct input terminal 91 and an inverted input terminal 92 as well as an output terminal 93. The feedback network includes a variable capacitor 100 having sections 101-104 controlled by a tap switch 105. The network further includes a variable capacitor 110 having sections 111-114 controlled by a tap switch 115. The common lead of the capacitor 110 is returned to reference point R.

The three tap switches 65, 105 and 115 are all connected to a common manual tap switch control 116. The capacitors 101-104 and 111-114 are calibrated to produce resonance at stepped frequencies over the feedback-susceptible portion of the audio range lying between 100 Hz and 2500 Hz. The frequency range is preferably divided as follows: 100-200 Hz., 200-500 Hz., 500-1000 Hz. and 1000-2500 Hz.

In carrying out the present invention a manual control is, in addition, provided for smoothly and steplessly sweeping the resonant frequency of the network between the steps of the tapped control so as to achieve a zero beat condition with an acoustic feedback signal. This is achieved by a variable resistance network 120 having ganged potentiometers 121, 122 with associated fixed resistors 123, 124 and 125, 126. The variable resistors are brought out to a manual control knob 127. Thus it is possible by a combination of stepped and smoothly variable adjustment to approach, for zero beating, any frequency within the available range.

For the purpose of completing the amplifier loop, indicated at 130, a resistor 131 is connected from the output terminal 93 of the resonant operational amplifier 90 to the input terminal 54 of the operational amplifier 55. In accordance with one of the aspects of the present invention, the resistance in the loop circuit is compensatingly varied as a function of the range of frequency selected by the tap switch control knob 116. In the present instance this is accomplished by tap switch 65 which, moved by its drive connection, switches into the circuit the appropriate one of the resistors 61-64. This maintains the size of the notch at reference level in each of the frequency bands and makes the notch depth nearly independent of frequency. The width of the notch is determined by the Q of the circuit. It is found that a Q is readily obtainable, using active filters, to produce a notch of optimum width, which is considered to be 1/20 octave, and even narrower widths are obtainable. The term "sharply peaked" as used herein refers to a band width on the order of 1/20 octave. The operation of the circuit as thus far described may be summarized as follows: The audio signal in the basic system, and which is picked up on line L1 at the output of the operational amplifier 34, is applied to the input terminal 54 of a first inverting amplifier 55 in the loop circuit. The amplified signal, subject to attenuation in the series resistors 60, 70 is further amplified and re-inverted by the second operational amplifier 80 to produce an amplified, in-phase output signal at terminal 81. Such signal, fed to the input terminal 91 of the resonant, non-inverting operational amplifier 90, is amplified and appears at output terminal 93. The capacitor networks 100, 110 and resistor network 120 are so chosen that the negative feedback signal can be blocked at any frequency within the feedback-susceptible portion of the audio range, that is, at any frequency lying between the limits of 100 Hz. and 2500 Hz. The result is to produce a sharply defined peak in the frequency characteristic of the loop 130 at the frequency established by the tap switch 116 and variable control 127.

However, in carrying out the present invention the signal which is derived from the notch loop circuit is not the direct signal produced across the operational amplifier 90 but is the inversion of such signal which is taken from across the inverting amplifier 55. Thus the signal which is derived from the loop circuit and which is applied via the voltage dividing resistor 50 to the summing buss L2 is in the form of a narrow peak in the characteristic which, applied to the signal in the system in an out-of-phase relation, produces a notch in the frequency characteristic curve of the system.

In accordance with one of the important features of the present invention, means are provided for causing the loop circuit 130, which includes the resonant operational amplifier 90, to oscillate at the resonant, or notch, frequency to produce a reference signal which is capable of being adjusted into zero beat relation with an acoustic feedback signal in the system for thereby adjusting the notch frequency into cancelling relation. This is accomplished, in the present system by providing sufficient gain in the amplifiers of the loop to achieve oscillation, by normally including sufficient series resistance so as to defeat oscillation, and by intentionally, and temporarily, shunting the series resistance so that oscillation is induced. Thus I provide a shunting switch for shunting the series resistance networks 60, 70 with a resistor having a sufficiently low value as to reduce the total loop resistance to the point of oscillation. The shunting switch, indicated at 140, and which is preferably of the pushbutton type, connects an auxiliary shunting resistor 141 directly between the output terminal 56 of the amplifier 55 and the input terminal 75 of the amplifier 80, the shunting resistor typically having a resistance on the order of 13,000 ohms.

In accordance with a related aspect of the invention, means are provided for simultaneously decoupling the loop circuit from the system in order to reduce the amplitude of the reference signal to a level which is more nearly that of the acoustic feedback signal. Such decoupling is accomplished by employing a gang switch including sections 52, 59 which are mechanically connected to the shunting switch 140 by a link 142. Thus when the switch 140 is closed, switches 52, 59 are both simultaneously opened. The switch 52 disconnects the loop circuit from the input line L1, while the opening of the switch 59 inserts in series with L2 a high value coupling resistor 143. The oscillation of the loop circuit, coupled to the summing bus by the resistor 143, produces an audible sine wave reference signal in the system which can be distinguished from the offending acoustic feedback signal. By stepping the frequency selector control 116, the reference signal can be brought into the approximate frequency range of the acoustic feedback signal. By subsequent manual rotation of the variable frequency control 127, the reference signal can be smoothly swept into zero beat condition with the acoustic feedback signal, thereby signalling that the notch is in a condition of alinement with the feedback signal and that frequency adjustment is complete. Note that the frequency adjustment may be completed without any actual measurement of the frequency of the offending wave.

When this condition has been attained, the shunting switch 140 may be restored to its normal open condition, cutting off the oscillation, and with the accompanying closing of switches 52, 59 causing the loop circuit to be recoupled to the lines L1, L2 for producing an aligned notch in the frequency response curve. The notch is then deepened by adjustment of the tap switch 74 to increase the auxiliary signal to the point where the acoustic feedback signal is completely cancelled. Indeed, the notch is preferably deepened beyond the point of cancellation to avoid any condition of marginal feedback as the system gain control is further advanced. This completes adjustment of the notch filter 21.

Normally there will be more than a single frequency of acoustic feedback. Thus turning up the system gain control 16 will again cause the system to "squeal", this time at a different frequency. The above process is then repeated using the notch filter 22 for purposes of cancellation. The system gain control is then still further advanced causing acoustic feedback at a still different frequency, which is taken care of by the notch filter 23. This process is repeated for as many offending frequencies as may be found, up to a total of five. If there are more than five such frequencies, resort may be had to the auxiliary notch filter assembly 20a (FIG. 1) interposed in series with the first.

After all of the notch filters have been activated and adjusted, the controls 116, 127 thereof should be checked for duplication. It is possible that with the successive increase in system gain the system may break out in acoustic feedback a second time at the same frequency. If duplication is noted the notch depth in one of the notch filters may be increased and the redundant notch filter may be deactivated.

In accordance with an important feature of the invention, the notch filter circuit described in detail above is capable of producing notches in the frequency characteristic which are much sharper than those achievable with prior audio-frequency notch filters. In effect, the circuit utilizes a two stage approach wherein the filter amplifier 90 establishes the basic bandpass characteristic, and a portion of that characteristic is fed back to the summing amplifier 55 to increase the gain thereof near the center frequency of the pass band, thereby to provide a more sharply defined notch than conventional circuits. It is seen that the summing amplifier 55, itself, has a basic gain established by the value of negative feedback resistor 57 and its relationship to that of input resistor 53. In parallel with the feedback resistor 57, however, is the series combination of amplifiers 80, 92. More specifically, it is seen that the output of amplifier 55 is coupled to the input of amplifier 80, which in turn, drives amplifier 90 whose output is returned to the summing input of amplifier 55.

The filter amplifier 90 has a bandpass characteristic by reason of the feedback circuit 120. It is seen that that circuit is, in fact, a "bridged-T", with resistors 121, 123, 124 and resistors 122, 125, 126 forming respective arms of the T, the capacitor 110 forming the vertical member of the T, and the capacitor 100 forming the bridge. This bridged-T arrangement forms a bandpass filter in which the bandwidth is established by the ratio between capacitors 100 and 110. The center frequency, however, is adjustable by virtue of resistors 121, 122, and may be adjusted over a substantial range without affecting the bandwidth established by the aforementioned capacitor ratio. The filter amplifier 90 having such a bandpass filter as a feedback impedance is well adapted to provide the variable frequency operation required herein. Unfortunately, however, such a circuit does not have a particularly sharply defined pass band, but exhibits a pass characteristic with relatively sloping shoulders and a bandwidth which in a practical case may be about 20% of the center frequency. If this characteristic were used directly in producing the notch in the input signal, satisfactory operation would not be achieved.

Thus, in accordance with one aspect of the invention, the output of the filter amplifier 90 is fed back to the input of summing amplifier 55 by way of feedback resistor 131 to provide positive feedback to the amplifier 55 over a portion of the bandwidth of amplifier 90, thereby to increase the gain of the amplifier 55 near the center frequency and over only a portion of the bandwidth. Thus, the output of amplifier 55 will produce a comparatively sharp peak at the center frequency of the amplifier 90 and having a bandwidth of, for example, only about 2% of the center frequency. Stated differently, the amount of positive feedback produced by the feedback path comprising amplifiers 80 and 90 far from the center frequency of the pass band of amplifier 90 is very small so that the basic gain of amplifier 55 established by the negative feedback resistor controls. As the center frequency is approached, on the shoulders of the pass band of amplifier 90, the gain of the positive feedback path becomes greater, but remains insignificant as compared to the basic gain of the amplifier 55. However, as the center frequency of the pass band is approached, the gain of the positive feedback circuit rises, for example, approximately 30 db. above the off frequency gain, providing substantial positive feedback to the amplifier 55 to sharply increase the gain thereof, producing a sharply defined peak at the center frequency and over a portion only of the bandwidth of amplifier 90.

This sharply peaked characteristic is important not only in effectively cancelling only the undesired frequency, but also in minimizing phase shift of signals near the center frequency but outside the narrow bandwidth. If, for example, the peak were relatively wide or lacking sharp definition, appropriate adjustment would serve to cancel an offending frequency, but would also introduce phase shift at frequencies near the center frequency on the shoulders of the notch. Appreciating the fact that an offending frequency in the characteristic of the sound system will produce oscillation only if the total system phase shift is an integral multiple of 360°, it is realized that substantial peaks may exist in the system which, due to a favorable phase shift at those frequencies are incapable of generating oscillation. But, if in cancelling an offending frequency the system tends to shift the phase of nearby frequencies, a previously ineffectual peak may be shifted in phase by an amount sufficient to cause oscillation at that frequency, further aggravating the equalization problem. Because the instant filter circuit produces a sharply defined notch having minimal phase shift at frequencies adjacent the notch, cancellation of a peak at a particular frequency can be accomplished without the danger of shifting a previously inoffensive peak into an oscillating mode.

As a further advantage of the instant notch filter assembly, it will now be apparent that the important notch characteristics, that is the center frequency, bandwidth and depth of the notch are independent, and that, therefore, one of the characteristics may be adjusted with little, if any, effect on the others. As noted above, the bandwidth is established by the ratio between capacitors 100, 110, while the center frequency is established, independently of the bandwidth, by selection of a particular pair of such capacitors as well as the adjustment of resistors 121, 122. Furthermore, the notch depth is adjustable, independently of the aforementioned parameters, by the switch 74 which adjusts the gain of amplifier 80.

For the sake of completeness, reference may be made to a typical power supply which may be used in connection with the above described circuitry, and which is indicated at 150 in FIG. 3. The power supply includes a transformer 151 having a bridge rectifier 152 and a filter capacitor 153. Voltage regulation is provided by means of a zener diode 154 having a dropping resistor 155, and final filtering is provided by a capacitor 156 having an associated resistor 157. A voltage divider 158, the lower portion of which is shunted by a capacitor 159, provides reference voltage for terminals R of the various operational amplifiers. The upper and lower terminals 160, 161 provide voltage for pins 7 and 4 of the operational amplifiers.

While the above description of the circuit, and the functions it is intended to perform, taken in connection with the available data on the cross referenced commercial amplifiers, provides sufficient information for one skilled in the art to practice the invention, the following circuit values, keyed to the reference numerals, may be considered representative:

| 32 | 0.22 mf. | 55 | Type 741 op. amp. | 114 | 0.00282 mf. |
|---|---|---|---|---|---|
| 33 | 100 K ohm | 57 | 10 K ohm | 121 | 50 K ohm |
| 34 | Type 741 op. amp. | 58 | 10 K ohm | 122 | 50 K ohm |
| 35 | 1 K ohm | 61–64 | 50 K ohm | 123 | 120 K ohm |
| 36 | 27 K ohm | 71 | 4.7 K ohm | 124 | 20 K ohm |
| 37 | 68 K ohm | 72 | 360 ohm | 125 | 120 K ohm |
| 38 | 1.5 mf. | 73 | 750 ohm | 126 | 20 K ohm |
| 39 | Type 1709 op. amp. | 80 | Type 741 op. amp. | 131 | 120 K ohm |
| 41 | 430 K ohm | 82 | 10 K ohm | 141 | 13 K ohm |
| 42 | 1.5 K ohm | 83 | 10 K ohm | 143 | 3.3 M ohm |
| 43 | 15 pf. | 90 | Type 741 op. amp. | 153 | 1000 mf. |
| 44 | 820 pf. | 101 | 0.01 mf. | 154 | 1N5361B |
| 45 | 1 K ohm | 102 | 0.0047 mf. | 155 | 220 ohm |
| 46 | 30 and 220 pf. | 103 | 0.0018 mf. | 156 | 1000 mf. |
| 47 | 56 ohm | 104 | 820 pf. | 157 | 100 ohm |
| 48 | 47 mf. | 111 | 0.10 mf. | 158 | 10 K, 11 K ohm |
| 50 | 100 K ohm | 112 | 0.047 mf. | 159 | 33 mf. |
| 53 | 100 K ohm | 113 | 0.018 mf. | | |

Although the invention has been described in connection with circuitry and its mode of use, it will be clear to one skilled in the art that the invention has well-defined method aspects. The method includes the steps of providing, coupled to a sound system, an operational amplifier connected in a loop circuit and having a resonant feedback network producing an auxiliary signal having a sharply peaked frequency characteristic. The gain of the system is increased until an acoustic feedback signal is produced. The gain in the loop circuit is then temporarily increased until the loop circuit oscillates at the resonant frequency to produce an audible reference signal, with the resonant frequency being smoothly varied to bring the reference signal into zero beat with the acoustic feedback signal. The auxiliary signal is relatively inverted and applied to the system to produce a notch in the frequency characteristic of the system at the frequency of the acoustic feedback signal, the amplitude of the auxiliary signal being increased as necessary to obtain complete cancellation of the feedback signal.

The gain of the system is then incrementally advanced so that a successive acoustic feedback occurs at a different frequency. The procedure is repeated using a second operational amplifier connected in a similar loop circuit, until the second acoustic feedback signal has been disposed of. The system gain is still further advanced and additional acoustic feedback signals are taken care of in similar fashion.

While the term "audible" has been used to describe the reference signal which is created for zero beating purposes, and while it is convenient to adjust to zero beat by ear, it will be understood that the invention is not limited thereto and coincidence may be indicated, if desired, on an oscilloscope. The term "resonant" as applied to the feedback network includes circuitry which, in combination with components in the associated operational amplifier, is frequency selective for the purpose set forth. The term "inverting" refers to relative inversion. While it is convenient to reduce series resistance for the purpose of temporarily increasing gain to bring about oscillation of the loop circuit, the term "increasing gain" will be understood to be a general term applied to means for securing oscillation at the resonant (notch) frequency. In the preferred embodiment of the invention three amplifiers are included in the loop, but this does not preclude the possibility of using a different number connected so as to be capable of performing the recited function.

In the preferred form of the invention the network which feeds back a signal from the output terminal 93 of operational amplifier 90 to the inverted input terminal 92, and which has been referred to as a "resonant" network, consists entirely of capacitors 100, 110 and resistors 120. The effect of the network is to provide the amplifier 90 with a bandpass characteristic having a substantial increase in gain at the center of the pass band. Because the amplifier 90 provides positive feedback in the overall loop circuit, and specifically to the input of amplifier 55, the gain of amplifier 55 is sharply increased at the center of the pass band, over a range of frequencies having a width on the order of 1/20 octave, with the result that a sharply defined peak is formed in the frequency characteristic, the peak being inverted to form a notch in the characteristic curve. Indeed, within the narrow band the feedback may become positive. The use of resistors and capacitors, solely, for this purpose is desirable since such components can be produced at less cost than inductances and can be easily varied continuously over a wide range. However, it will be understood that the term "resonant feedback network" is not limited to a circuit employing resistors and capacitors but includes any network, for example, a parallel-connected LC circuit which provides the desired bandpass characteristic in the feedback loop centered at the selected frequency.

Also it will be understood that reference to "cancellation" of an acoustic feedback signal by incorporating an aligned notch in the system characteristic curve is used to facilitate understanding of the invention. What is being referred to is the "effective cancellation" of the acoustic feedback signal resulting from the reduction in system gain, by reason of the notch, at the frequency of the feedback signal to the point that oscillation of the system at such frequency cannot occur.

It will be apparent that the feedback elimination apparatus amply fulfills the objects set forth above, permitting each successively produced acoustic feedback signal to be identified and cancelled out by temporarily placing a notch filter in an oscillating mode with subsequent adjustment to zero beat, thereby making unnecessary any actual measurement of the frequencies of the respective feedback signals. The system and procedure not only simplify the initial adjustement by dispensing entirely with any measuring equipment, but also make it practical for a system operator, even one with limited skill or experience, to quickly run through the adjusting steps whenever desired for confirmatory purposes or for "touch-up" whenever a minor change is made in the acoustical environment as, for example, the shifting or addition of loudspeakers, shifting of microphone position, or the like.

However, quite apart from the inherent capability of the apparatus in cancelling acoustic feedback signals is its continuing reliability under practical conditions, particularly considering the fact that active filters are employed which are relatively complex, consisting of a large number of interdependent elements, each of which is a candidate for possible failure. Where a plurality of active notch filters are employed in series relation, as has been proposed in the past, failure of any of the individual notch filters results in failure of the system, whereas where the individual notch filters are connected in parallel as taught in the present invention, conventional types of failure are not capable of disabling the system, but result only in the failure of the individual notch which can usually be compensated for by a slight downward gain adjustment of the system until the offending one of the filters can be replaced. The system employing the present invention is therefore almost entirely "fail-safe" regardless of the degree of sophistication, i.e. complexity, of the circuits employed in the individual notch filters. Moreover, largely because the filters are connected in parallel, rather than in series, they cannot contribute cumulative phase error in the signal and, indeed, there is zero phase shift at the center of the notch.

As will be apparent, the ability to increase the loop gain to a level greater than 1 to make the system oscillate at the frequency established by the notch filter is an important feature of the present invention. However, in certain circumstances, it may be desirable to achieve the improved performance resulting from the filter itself while foregoing the practical advantages of the self-oscillation alignment procedure. In this case, it is possible to use an auxiliary oscillator for aligning the filter circuit assembly to cancel peaks in the room response characteristic. To that end, an auxiliary oscillator is connected into the sound system, such as to the mixer amplifier. With the oscillator amplitude reduced to zero level, the gain control of the sound system is advanced until a feedback point is detected, just as is done in the self-oscillating alignment method. After the peak is located, the oscillator amplitude is increased to produce a second audible tone in the system. The oscillator frequency is then tuned to zero beat the feedback frequency.

Without changing the frequency setting of the auxiliary oscillator, the oscillator is disconnected from the system and connected to a selected one of the notch filters for the purpose of tuning the filter. A meter is connected to the output of the filter circuit for indicating the signal level passed therethrough. The oscillator amplitude may be adjusted to achieve a desired reference level on the meter. The filter is then tuned while watching the meter until a point is reached at which the meter dips. At this point the filter and oscillator are adjusted to the same frequency, the frequency, it is recalled, which caused the initial feedback peak. The filter is then switched into the system and the notch depth adjusted to cancel the offending peak.

While the "notch" nature of the filter circuitry has been emphasized, with each "notch" effectively cancelling a "peak" in the system characteristic, it will be understood that the terms are relative and that the oppositeness of phase, for effective cancellation, is the important quality. Thus where the main amplifier signal is inverted so that, rather than a peak, it evidences a notch at the feedback frequency, the invention may be considered to reside in means for forming an artificial peak which is added to the inverted signal before such signal is reinverted for feeding into the loudspeakers. Accordingly, the terms "notch" and "peak" are to be considred as interchangeable provided the oppositeness of phase is maintained.

I claim as my invention:

1. In a notch filter, the combination comprising a filter amplifier having a bridged T feedback path for providing a bandpass characteristic thereto, said feedback path having adjustment means for establishing the bandwidth and independent adjustment means for setting the center frequency of the pass band, a summing amplifier having an input signal coupled thereto and a negative feedback path for establishing the gain thereof, means connecting the output of the summing amplifier to the input of the filter amplifier, and means feeding a portion of the output signal of the filter amplifier to the input of the summing amplifier as positive feedback to increase the gain of the summing amplifier over a portion only of the bandwidth of the filter amplifier, said portion being on the order of 1/20 octave, thereby to establish a peak at the output of the summing amplifier sharper than the pass characteristic of the filter amplifier.

2. A notch filter circuit for producing a notch in an input signal at a desired frequency comprising, in combination, a summing amplifier having a feedback path for establishing the gain thereof, means applying said input signal to said summing amplifier, a filter amplifier receiving the output of said summing amplifier, said filter amplifier having a feedback path for providing a bandpass characteristic thereto, means for adjusting the last mentioned feedback path for locating said pass band at the desired frequency, and means coupling the output of said filter amplifier to the input of said summing amplifier for providing positive feedback thereto at frequencies within about 1/20 octave of the center frequency of said pass band so that the output of said summing amplifier follows the input signal with a narrow notch at the center frequency of said pass band, said notch being sharper than the pass characteristic of said filter amplifier.

3. A notch filter assembly comprising in combination a summing bus for receiving an input signal, a plurality of active notch filters driven in parallel from said summing bus, each of the notch filters comprising a summing amplifier connected to the summing bus, feedback means for establishing the basic gain of said summing amplifier, a filter amplifier driven from the output of said summing amplifier, said filter amplifier having feedback means for providing a bandpass characteristic thereto, means for adjusting the feedback means to establish a center frequency for said pass band, means coupling the output of said filter amplifier to the input of said summing amplifier for providing positive feedback to increase the gain of the summing amplifier in a band within about 1/20 octave of the center frequency of the pass band of said filter amplifier, said notch filter assembly further comprising means for summing the outputs of the plurality of summing amplifiers in inverted phase relationship with said input signal to produce narrow notches in said input signal at the center frequencies of the respective filter amplifiers.

4. A notch filter assembly for producing notches in an input signal at desired frequencies comprising in combination, a buffer amplifier for receiving said input signal and driving a common bus, a plurality of active notch filters driven from said common bus, each of said notch filters including an inverting summing amplifier and a filter amplifier, means coupling the common bus to the summing amplifier, said summing amplifier having feedback means for establishing the basic gain thereof, means coupling the output of said summing amplifier to the input of said filter amplifier, said filter amplifier having bandpass feedback means for providing a bandpass characteristic thereto, adjustment means in the bandpass feedback means for adjusting the center frequency of said filter amplifier to one of said desired frequencies, means coupling the output of the filter amplifier to the input of said summing amplifier for providing positive feedback thereto in a band of frequencies within about 1/20 octave of the center frequency thereby to sharply increase the gain thereof in said band, said notch filter assembly further comprising means summing the outputs of all of the summing amplifiers and the input signal on said common bus to produce an output signal having narrow notches at the center frequencies of the respective filter amplifiers.

* * * * *